US012650470B2

(12) United States Patent
Franke

(10) Patent No.: US 12,650,470 B2
(45) Date of Patent: Jun. 9, 2026

(54) MONITORING DEVICE WHICH CAN BE ASSEMBLED FOR AN ELECTRIC ENERGY STORAGE DEVICE, ELECTRIC ENERGY STORAGE DEVICE, AND MOTOR VEHICLE

(71) Applicant: Bayerische Motoren Werke Aktiengesellschaft, Munich (DE)

(72) Inventor: Torsten Franke, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 198 days.

(21) Appl. No.: 18/578,040

(22) PCT Filed: Aug. 10, 2022

(86) PCT No.: PCT/EP2022/072397
§ 371 (c)(1),
(2) Date: Jan. 10, 2024

(87) PCT Pub. No.: WO2023/046359
PCT Pub. Date: Mar. 30, 2023

(65) Prior Publication Data
US 2024/0329141 A1 Oct. 3, 2024

(30) Foreign Application Priority Data

Sep. 21, 2021 (DE) ..................... 10 2021 124 368.8

(51) Int. Cl.
*G01R 31/371* (2019.01)
*G01R 31/3835* (2019.01)
(Continued)

(52) U.S. Cl.
CPC ....... *G01R 31/371* (2019.01); *G01R 31/3835* (2019.01); *H01M 10/482* (2013.01);
(Continued)

(58) Field of Classification Search
None
See application file for complete search history.

(56) References Cited

U.S. PATENT DOCUMENTS

2002/0182480 A1* 12/2002 Hanauer ............. H01M 50/209
429/62
2013/0207596 A1 8/2013 Zichner et al.
2020/0036058 A1 1/2020 van Lammeren

FOREIGN PATENT DOCUMENTS

DE 10 2011 016 373 A1 10/2012
DE 10 2012 001 440 A1 8/2013
(Continued)

OTHER PUBLICATIONS

International Search Report (PCT/ISA/210) issued in PCT Application No. PCT/EP2022/072397 dated Nov. 23, 2022 with English translation (4 pages).

(Continued)

*Primary Examiner* — Jas A Sanghera
(74) *Attorney, Agent, or Firm* — Crowell & Moring LLP

(57) ABSTRACT

A monitoring device for monitoring energy storage device components of an electric energy storage device has a regular arrangement of identically constructed circuit segments, from which at least one sub-arrangement can be separated with the number of circuit segments required for the electric energy storage device. The monitoring device additionally has a flexible circuit carrier with a plurality of identically constructed sections connected via separation points. Each circuit segment has a section, a monitoring unit for monitoring at least one energy storage device component, a contacting unit which is electrically connected to the monitoring unit and can be connected to the at least one energy storage device component, and a communication unit for transmitting an energy storage device component-spe- (Continued)

cific monitoring signal between the monitoring unit and a controller of the electric energy storage device.

10 Claims, 3 Drawing Sheets

(51) Int. Cl.
    H01M 10/48         (2006.01)
    B60L 58/10         (2019.01)

(52) U.S. Cl.
    CPC ........... H01M 10/486 (2013.01); *B60L 58/10* (2019.02); *H01M 2220/20* (2013.01)

(56)               References Cited

FOREIGN PATENT DOCUMENTS

DE     10 2017 204 138 A1     9/2018
EP         3 849 006 A1     7/2021

OTHER PUBLICATIONS

German-language Written Opinion (PCT/ISA/237) issued in PCT Application No. PCT/EP2022/072397 dated Nov. 23, 2022 with English translation (11 pages).
German-language Search Report issued in German Application No. 10 2021 124 368.8 dated Sep. 1, 2022 with partial English translation (13 pages).

* cited by examiner

MONITORING DEVICE WHICH CAN BE ASSEMBLED FOR AN ELECTRIC ENERGY STORAGE DEVICE, ELECTRIC ENERGY STORAGE DEVICE, AND MOTOR VEHICLE

BACKGROUND AND SUMMARY

The invention relates to a monitoring device for monitoring energy storage device components of an electric energy storage device. The invention also relates to an electric energy storage device and to a motor vehicle.

In the present case, the focus is on electric energy storage devices which can be used, for example, as traction batteries for electrified motor vehicles, that is to say electric or hybrid vehicles. Such electric energy storage devices usually have a plurality of energy storage device components, for example energy storage device cells, and at least one control device. In order to monitor the energy storage device cells of the energy storage device, the prior art discloses the practice of exchanging monitoring signals, for example control signals and information signals containing cell-specific characteristic variables, between the energy storage device cells and the control device. Monitoring units having sensors and actuators are usually arranged on the energy storage device cells for this purpose. In this case, signals can be transmitted between the monitoring units and the control device in a wired manner, for example. However, the disadvantage of this is the high level of outlay for transmitting signals between the monitoring units at different potentials and the superordinate control device and the high level of variance in the signal paths used on account of their structural dependence on the number of energy storage device cells which are connected in series and are included in a signal path. The application of monitoring units close to the cells in turn results in a high level of outlay for installing the monitoring units during the manufacture of the energy storage device.

The object of the present invention is to provide a monitoring device that is particularly easy to install for an electric energy storage device.

This object is achieved by a monitoring device, an electric energy storage device and a motor vehicle having the features according to the claimed invention.

A monitoring device according to embodiments of the invention for monitoring energy storage device components of an electric energy storage device has a regular arrangement of structurally identical circuit segments. At least one sub-arrangement having a number of circuit segments needed for the electric energy storage device can be separated from the arrangement, wherein the monitoring device has for this purpose a flexible circuit carrier having a plurality of structurally identical sections that are connected via separation points. Each circuit segment has a section, a monitoring unit for monitoring at least one energy storage device component, a contacting unit that is electrically connected to the monitoring unit and can be connected to contacting connections of the energy storage device components, and a communication unit for transmitting a monitoring signal specific to the energy storage device component between the monitoring unit and a control device of the electric energy storage device.

The invention also relates to an electric energy storage device having a plurality of energy storage device components, a control device and at least one sub-arrangement of a monitoring device according to embodiments of the invention, wherein the contacting units are electrically and mechanically connected to the contacting connections of the energy storage device component. The energy storage device components are preferably in the form of energy storage device cells or series circuits comprising at least two energy storage device cells. The electric energy storage device can be used, for example, as a traction battery for an electrified motor vehicle. The energy storage device cells of the energy storage device are in the form of round cells, in particular. The energy storage device cells can be interconnected to form a plurality of cell modules, wherein each cell module can have a plurality of parallel-connected series circuits comprising energy storage device cells.

The electric energy storage device also has a cell contacting system having cell connectors for interconnecting the energy storage device cells. The energy storage device cells each have two cell poles which are electrically connected to the cell connectors of the cell contacting system. The at least one sub-arrangement of the monitoring device is arranged, in particular, on the cell contacting system, and the contacting units are connected to the associated cell connectors for the purpose of monitoring the energy storage device cells or the series circuits.

In order to monitor the energy storage device components, monitoring units are arranged on the energy storage device components and are electrically connected to the contacting connections or sense contacts. In this case, in particular, one monitoring unit is arranged on one of the energy storage device cells of the series circuit for each series circuit of energy storage device cells. Each monitoring unit may have at least one sensor and/or actuator for the energy storage device components. The sensors may be, for example, voltage sensors, temperature sensors, current sensors or the like. The sensors capture monitoring signals in the form of information signals which can be transmitted to the control device of the energy storage device. The actuators may be, for example, state of charge equalization elements which can equalize a state of charge of the energy storage device cells by dissipating energy. For this purpose, the control device may generate, for example, monitoring signals in the form of control signals which can be transmitted to the actuators of the monitoring units.

In this case, the monitoring units are not individually applied to the energy storage device cells or energy storage device cell series circuits, in particular, but rather are combined in such a manner that a plurality of monitoring units can be arranged on a plurality of energy storage device components in one application step. The monitoring device which can be assembled and has a plurality of structurally identical monitoring units, a plurality of structurally identical contacting units and a plurality of structurally identical communication units is provided for this purpose. These units are arranged on sections of the flexible circuit carrier which can be separated from one another, wherein a monitoring unit, a contacting unit and a communication unit are arranged for each section and are electrically connected to one another. Each section equipped in this manner forms a circuit segment. In order to adapt the monitoring device to the specific energy storage device, a sub-arrangement, that is to say individual circuit segments or a contiguous group of circuit segments, can be separated from the regular, repeating arrangement of circuit segments.

For example, the monitoring device may be in the form of a tape which can be rolled up and from which a strip having at least one circuit segment can be separated as the at least one sub-arrangement. The strip can therefore be routed by interconnecting energy storage device components and can be produced in such a manner that it has the number of circuit segments matching the number of energy storage device components to be monitored. As a result of the fact that the circuit carrier is flexible, it can be adapted to a contour of the arrangement surface, that is to say can be routed via interfering contours of the arrangement surface, for example. The sections for monitoring the temperatures of the energy storage device cells are connected to the energy storage device cells in a highly thermally conductive manner, for example. In order to monitor the cell voltages, possibly also to supply energy to the monitoring units, the contacting units electrically connected to the monitoring units are electrically connected to the cell poles of the energy storage device cells or to the cell connectors of the cell contacting system. The communication unit can then transmit the monitoring signals captured by the sensors to the control device or can receive a monitoring signal for controlling the actuators from the control device. Signals are transmitted between the communication units and the control device on the basis of a communication protocol, with the result that the monitoring signals can be assigned to the specific circuit segments and therefore to the specific energy storage device components.

In this case, provision may be made for the communication unit to have at least one communication element for emitting and/or receiving acoustic and/or optical monitoring signals, which communication element can be coupled into a waveguide of the electric energy storage device, which is coupled to the control device, and/or can be coupled out of the waveguide. Signals are therefore transmitted wirelessly between the circuit segments and the control device. Each communication unit may have at least one transmitting element, for example an LED for emitting optical signals and/or a loudspeaker for emitting acoustic signals, and at least one receiving element, for example a photodiode for receiving optical signals and/or a microphone for receiving acoustic signals.

According to this embodiment, the electric energy storage device has the waveguide which is in the form of a one-piece molded part, for example. The one-piece molded part is designed to couple at least two energy storage device components to the control device in a potential-free manner and for this purpose has at least one collection channel and connection channels which are connected thereto and are coupled to the communication units of the circuit segments. The molded part is a finished part which can be arranged on the energy storage device components and the control device with only one assembly step. When arranging the molded part, the connection channels are arranged, in the form of coupling-in areas and coupling-out areas, on the communication units of the energy storage device components, and the at least one collection channel is arranged on the control device. For example, the at least one collection channel and the connection channels form a transmission network in the form of a bus network.

It proves to be advantageous if the at least one communication element is additionally in the form of a state of charge equalization element and is designed, in order to equalize a state of charge of the associated energy storage device cell, to dissipate excess energy of the energy storage device cell by converting it into an optical and/or acoustic signal. The excess energy of an energy storage device cell can therefore be used to operate the communication element of the associated circuit segment, which converts this excess energy into light and/or sound.

Provision may also be made for the communication unit of each circuit segment to have at least one electric signal path for transmitting electric monitoring signals between the circuit segments and the control device. The at least one electric signal path may be in the form of a conductor track, for example, which, starting from the monitoring unit, is routed to opposite edges of the section, where the separation points of the section are located. The conductor tracks may each form a contact surface of the signal path there.

For example, the signal paths of adjacent circuit segments may be electrically connected to one another so as to form a daisy chain, wherein the at least one signal path of a circuit segment on the edge of the sub-arrangement can be electrically connected to the control device. The contact surfaces of the signal paths are therefore arranged adjacent to one another at the separation points, with the result that the signal paths are routed through the sub-arrangement across the separation points. The contact surfaces which are arranged on the opposite edges of the sub-arrangement form the connections for the at least one electric signal path, which connections can be electrically connected to the control device and to a line termination, for example. The signal from a circuit segment, which is electrically connected to the control device at least with the interposition of the circuit segment on the edge, is therefore transmitted through the interposition of circuit segments to the control device.

The invention also includes a motor vehicle having at least one electric energy storage device described herein. The energy storage device forms, in particular, a traction battery of the motor vehicle which is in the form of an electric or hybrid vehicle.

The embodiments and their advantages presented with respect to the monitoring device described herein accordingly apply to the electric energy storage device described herein and to the motor vehicle described herein.

Further features of the invention emerge from the claims, the figures and the description of the figures. The features and combinations of features mentioned above in the description and the features and combinations of features mentioned in the description of the figures below and/or shown in the figures alone can be used not only in the respectively stated combination, but also in other combinations or alone.

The invention is now explained in more detail on the basis of a preferred exemplary embodiment and with reference to the drawings.

DETAILED DESCRIPTION OF THE DRAWINGS

In the figures, identical and functionally identical elements are provided with the same reference signs.

Figure 1A:
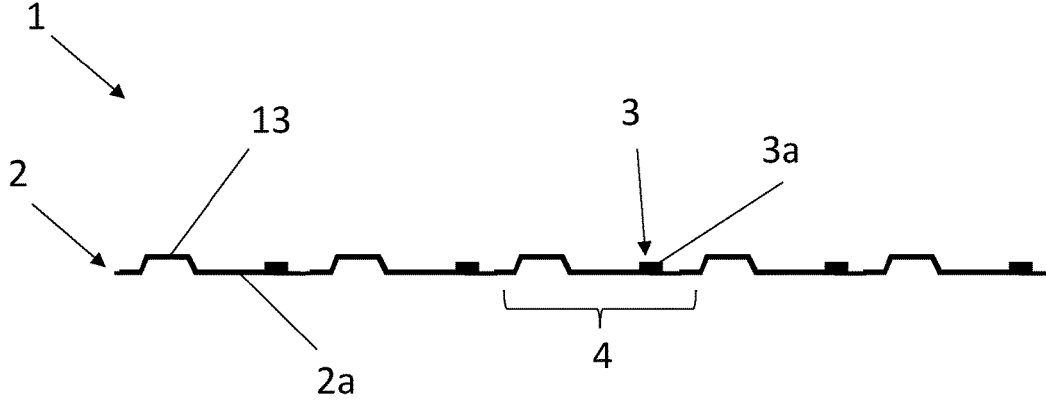
FIGS. 1a and 1b show a schematic illustration of a first embodiment of a monitoring device for an electric energy storage device.
Figure 1B:
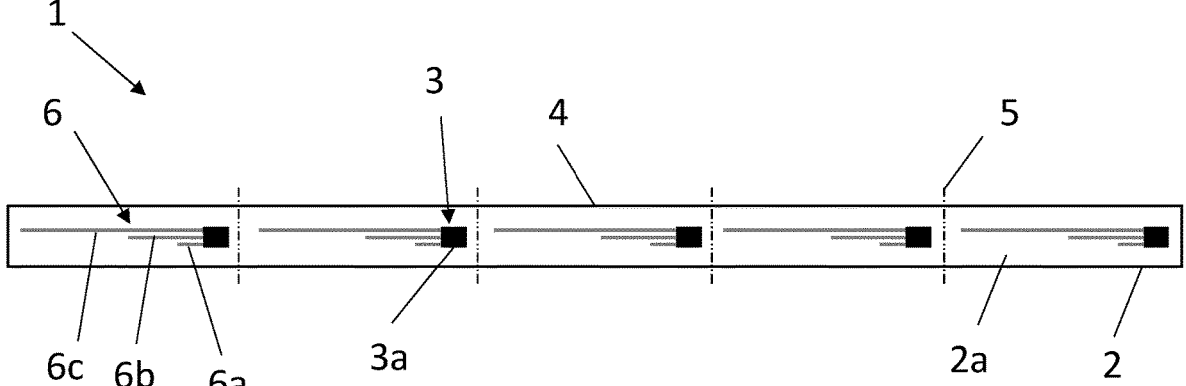
Figure 2A:
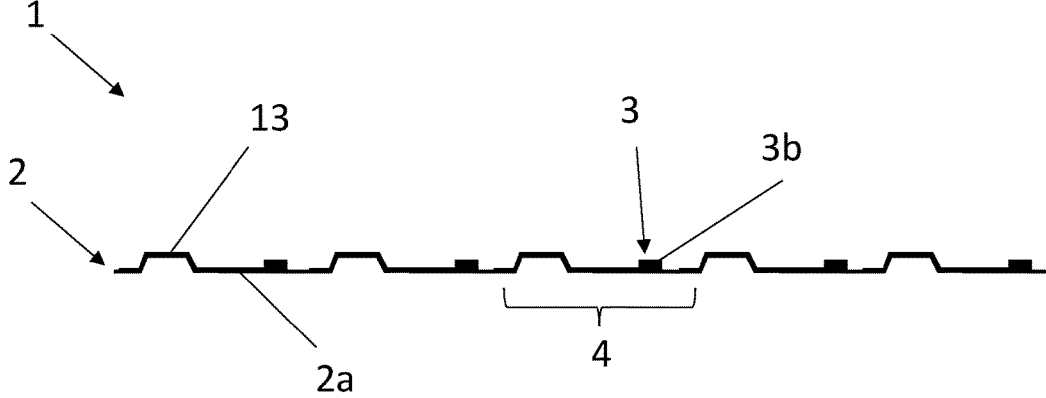
FIGS. 2a and 2b show a schematic illustration of a second embodiment of the monitoring device.
Figure 2B:
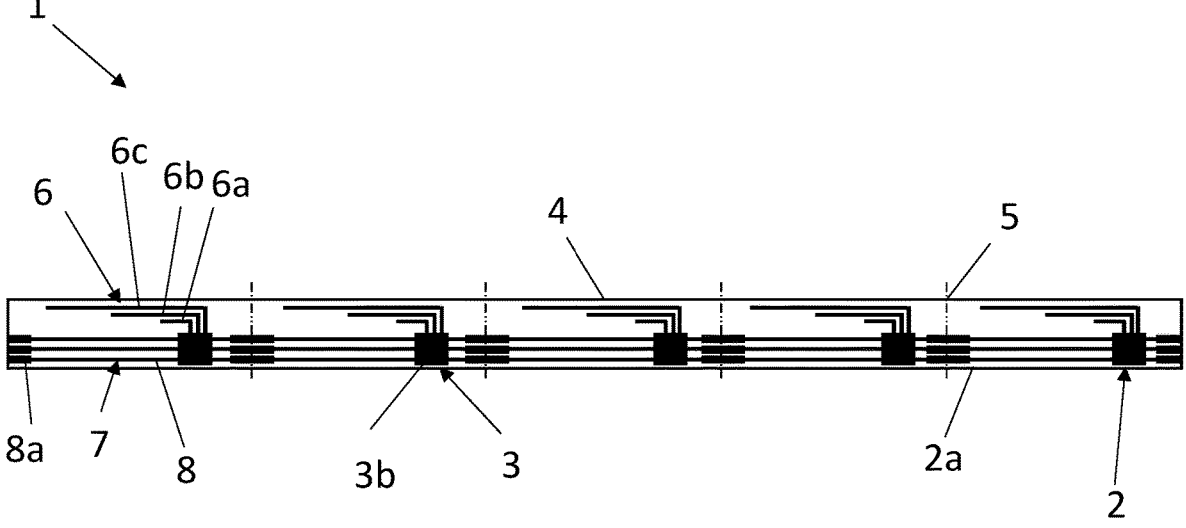

FIG. 1a and FIG. 1b show a side view (FIG. 1a) and a plan view (FIG. 1b) of a first embodiment of a sub-arrangement of a monitoring device 1 for an electric energy storage device. FIG. 2a and FIG. 2b show a side view (FIG. 2a) and a plan view (FIG. 2b) of a second embodiment of the sub-arrangement of the monitoring device 1. The monitoring device 1 is used, in particular, to monitor energy storage device cells of the electric energy storage device. The monitoring device 1 has a flexible circuit carrier 2 or a flexible carrier board having a plurality of sections 2a. The flexible circuit carrier 2 can be rolled up to form a roll. A monitoring unit 3 is arranged on each of the sections 2a so as to form an arrangement of repeating, structurally identical circuit segments 4. The monitoring units 3 may have sensors 3a, 3b for monitoring the energy storage device cells, for example. The sensors 3a, 3b may be, for example, voltage sensors and/or temperature sensors. The monitoring units 3 may also have actuators, for example for equalizing the state of charge or for cell balancing. Separation points 5 for assembling the monitoring device 1 are arranged between two sections 2a.

In addition, each circuit segment 4 has a contacting unit 6 for establishing electric contact between the associated monitoring unit 3 and associated sense contact points of the electric energy storage device which may preferably be situated on the energy storage device cells or a cell contacting system of the electric energy storage device. Here, the contacting unit 6 respectively comprises three electric connections 6a, 6b, 6c. In this case, a first electric connection 6a may be connected to a first cell pole of an energy storage device cell, a second electric connection 6b may be connected to a second cell pole of an energy storage device cell, and a third electric connection 6c may be connected, with the inclusion of an adjacent energy storage device cell, to an intermediate cell contact or an intermediate cell fuse. The electric connections 6a, 6b, 6c between the sensors 3a, 3b and the associated sense contact points of the electric energy storage device are preferably welded during application, and the flexible circuit carrier 2 below the sensor 3a, 3b is adhesively bonded to the energy storage device cells or the cell contacting system in a highly thermally conductive manner. In one particularly preferred application, the ends of a plurality of rolls of circuit carriers 2 can be mechanically and electrically connected to one another in such a manner that an endless circuit carrier 2 is produced and the application can be carried out without interruption and without waste.

A geometric size of the circuit segments 4 follows the repeating spacing of the energy storage device cells to be sensed, while taking into account an interference contour profile 13. The monitoring device 1 is preferably applied directly from the roll onto the cell contacting system or the fixed energy storage device cells with final assembly at the separation points 5. For example, a strip having a number of circuit segments 4 corresponding to the number of energy storage device cells to be monitored may be separated from the roll.

In a first embodiment, the sensor 3a of the monitoring unit 3 is a sensor 3a communicating with a waveguide of the electric energy storage device. In order to transmit signals by way of the waveguide, each circuit segment 4 has a communication unit which is not shown here and can be coupled to the waveguide. The communication unit may have a transmitting element, for example an LED for emitting optical signals, and/or a receiving element, for example a photodiode for receiving optical signals. The transmitting element may couple the optical signal into the waveguide and the receiving element may couple the optical signal out of the waveguide, wherein the waveguide may be coupled to a control device of the electric energy storage device. Optical signals can therefore be transmitted between the circuit segments 4 and the control device via the waveguide. Alternatively, the waveguide can also be designed to transmit acoustic signals, wherein the communication units of the circuit segments are designed to transmit and/or receive acoustic signals. The waveguide is, in particular, a singlepiece molded part which forms a transmission network and has a collection channel for connection to the control device and connection channels which are connected to the collection channel and are intended for connection to the communication units of the circuit segments 4.

In a second embodiment, a communication unit is shown in the form of an electronic bus 7, with the result that the sensor 3b of the sensor unit 3 is a sensor 3b communicating via the electronic bus 7. This electronic bus 7 has electric signal paths 8 in the form of conductor tracks which form contact surfaces 8a in the area of the separation points 5. The connection to the control device and to a signaling line termination can thus be effected at ends of a produced circuit carrier 2. The at least one sensor 3b comprises circuits for capturing and conditioning signals etc. in a similar manner to the sensor 3a and for electronic communication via the bus 7.

Figure 3:
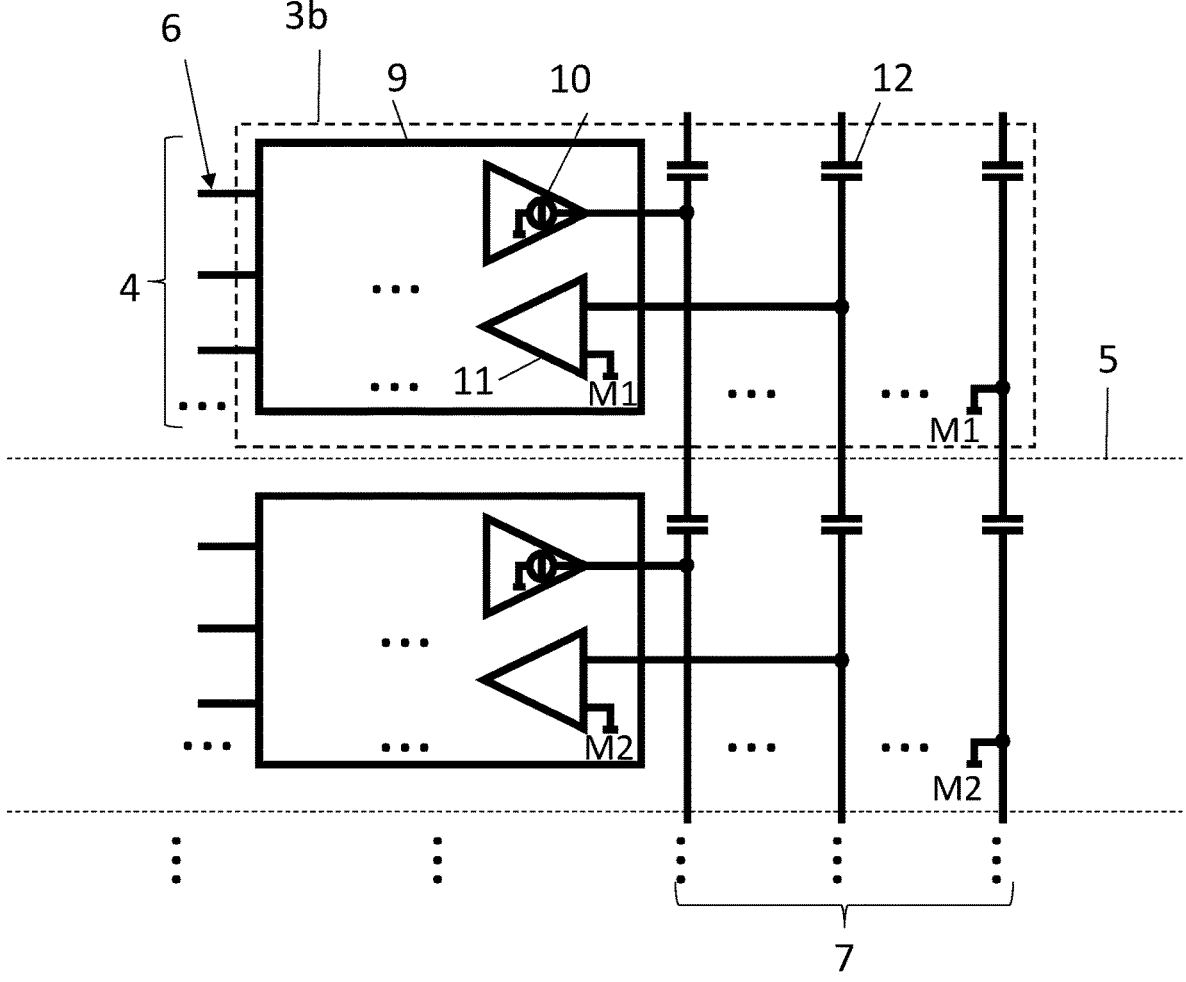
FIG. 3 shows an electronic circuit of circuit segments of the second embodiment of the monitoring device.

FIG. 3 shows an electronic circuit of the structurally identical circuit segments 4 for monitoring cells by way of an electronic bus 7. The sensor 3b has a sensor chip 9, the communication output 10 of which has a high impedance, that is to say is in the form of a current output, and the communication input 11 of which likewise has a high impedance, that is to say is in the form of a voltage input. The sensor 3b likewise comprises, in each signal path, a level converter or level shifter 12 for decoupling a DC voltage component between the circuit segments 4 and signal ground points M1, M2 associated with the individual circuit segments 4. In a simple case, the level shifter 12 is in the form of an electric capacitance. In this case, the level shifter 12 may contain further elements for balancing the DC voltage along the bus 7 or for suppressing interference signals.

What is claimed is:

1. A monitoring device for monitoring energy storage device components of an electric energy storage device, the monitoring device comprising:
   a regular arrangement of structurally identical circuit segments, from which at least one sub-arrangement having a number of circuit segments needed for the electric energy storage device is separable; and
   a flexible circuit carrier having a plurality of structurally identical sections that are connected via separation points, wherein:
   each circuit segment has a section, a monitoring unit for monitoring at least one energy storage device component, a contacting unit that is electrically connected to the monitoring unit and is connectable to the at least one energy storage device component, and a communication unit for transmitting a monitoring signal specific to the energy storage device component between the monitoring unit and a control device of the electric energy storage device.

2. The monitoring device according to claim 1, wherein: the arrangement is in a form of a tape which is rollable and from which a strip having at least one circuit segment is separable as the at least one sub-arrangement.

3. The monitoring device according to claim 1, wherein: each monitoring unit has at least one sensor and/or at least one actuator.

4. The monitoring device according to claim 1, wherein: the communication unit of each circuit segment has at least one communication element for emitting and/or receiving acoustic and/or optical monitoring signals, and the communication element is couplable into a waveguide of the electric energy storage device, which is coupled to the control device, and/or is replaceable out of the waveguide.

5. The monitoring device according to claim 4, wherein:

the at least one communication element is in a form of a state of charge equalization element and is configured, in order to equalize a state of charge of an associated energy storage device component in a form of an energy storage device cell, to dissipate excess energy of the energy storage device cell by converting the excess energy into an optical signal and/or an acoustic signal.

6. The monitoring device according to claim 1, wherein:

the communication unit of each circuit segment has at least one electric signal path for transmitting electric monitoring signals between the circuit segments and the control device.

7. The monitoring device according to claim 6, wherein:

the signal paths of adjacent circuit segments are electrically connected to one another so as to form a daisy chain, and the at least one signal path of a circuit segment on an edge of the sub-arrangement is electrically connectable to the control device.

8. An electric energy storage device comprising:

a plurality of energy storage device components;

a control device; and at least one sub-arrangement of the monitoring device according to claim 1, wherein the contacting units are electrically and mechanically connected to contacting connections of the energy storage device components.

9. The electric energy storage device according to claim 8, wherein:

the energy storage device components are in a form of energy storage device cells or in a form of series circuits comprising at least two energy storage device cells, the electric energy storage device has a cell contacting system with cell connectors for interconnecting the energy storage device cells, the at least one sub-arrangement is arranged on the cell contacting system, and the contacting units are connected to associated cell connectors for monitoring the energy storage device cells or the series circuits.

10. A motor vehicle comprising the electric energy storage device according to claim 8.

\*   \*   \*   \*   \*